(12) United States Patent
Chang et al.

(10) Patent No.: US 11,081,387 B2
(45) Date of Patent: Aug. 3, 2021

(54) CREATING AN ALIGNED VIA AND METAL LINE IN AN INTEGRATED CIRCUIT INCLUDING FORMING AN OVERSIZED VIA MASK

(71) Applicant: Marvell World Trade Ltd., St. Michael (BB)

(72) Inventors: Runzi Chang, San Jose, CA (US); Min She, Fremont, CA (US)

(73) Assignee: Marvell Asia Pte, Ltd., Singapore (SG)

( * ) Notice: Subject to any disclaimer, the term of this patent is extended or adjusted under 35 U.S.C. 154(b) by 28 days.

(21) Appl. No.: 16/713,044

(22) Filed: Dec. 13, 2019

(65) Prior Publication Data

US 2020/0118868 A1  Apr. 16, 2020

Related U.S. Application Data

(63) Continuation of application No. 16/106,205, filed on Aug. 21, 2018, now Pat. No. 10,522,394.

(Continued)

(51) Int. Cl.
  *H01L 21/768* (2006.01)
  *H01L 21/027* (2006.01)
  (Continued)

(52) U.S. Cl.
  CPC .... *H01L 21/76808* (2013.01); *H01L 21/0273* (2013.01); *H01L 21/02123* (2013.01); *H01L 21/02186* (2013.01); *H01L 21/0332* (2013.01); *H01L 21/0337* (2013.01); *H01L 21/2885* (2013.01); *H01L 21/31116* (2013.01); *H01L 21/31144* (2013.01); *H01L 21/67138* (2013.01); *H01L 21/67184* (2013.01); *H01L 21/67207* (2013.01); *H01L 21/7681* (2013.01); *H01L 21/76807* (2013.01); *H01L 21/76834* (2013.01); *H01L 21/76849* (2013.01); *H01L 21/76873* (2013.01); *H01L 21/76877* (2013.01); *H01L 2221/1015* (2013.01)

(58) Field of Classification Search
  CPC .......... H01L 21/76807; H01L 21/7681; H01L 21/0332; H01L 21/31144; H01L 2221/1015
  See application file for complete search history.

(56) References Cited

U.S. PATENT DOCUMENTS 9,911,652 B1  3/2018  Clevenger et al.
2006/0040491 A1*  2/2006  Lim ...................... H01L 21/288
                                                              438/637

(Continued)

*Primary Examiner* — Joseph C. Nicely

(57) ABSTRACT

A method of forming an integrated circuit includes: forming a dielectric layer, a hard mask layer, a film layer and a photoresist layer; and patterning the photoresist layer to form a via mask, where the via mask is oversized, such that the via mask extends across opposing sides of a metal line mask in the hard mask layer. The method further includes: etching the film layer and the dielectric layer based on the patterned photoresist layer; ashing the photoresist layer and the film layer; etching the dielectric layer based on a pattern of the hard mask layer to provide a via region and a metal line region; etching the hard mask layer and the dielectric layer; and performing a plurality of dual damascene process operations to form a via in the via region and a metal line in the metal line region in the integrated circuit.

20 Claims, 12 Drawing Sheets

Related U.S. Application Data

(60) Provisional application No. 62/562,846, filed on Sep. 25, 2017.

(51) Int. Cl.
*H01L 21/033* (2006.01)
*H01L 21/67* (2006.01)
*H01L 21/02* (2006.01)
*H01L 21/311* (2006.01)
*H01L 21/288* (2006.01)

(56) References Cited

U.S. PATENT DOCUMENTS

| | | | |
|---|---|---|---|
| 2012/0309189 A1* | 12/2012 | Park | H01L 21/76877 438/643 |
| 2015/0097293 A1 | 4/2015 | Yao et al. | |
| 2015/0380246 A1* | 12/2015 | Hu | H01L 21/0338 438/736 |
| 2017/0194253 A1* | 7/2017 | Wang | H01L 21/76877 |
| 2019/0043804 A1 | 2/2019 | Qian et al. | |
| 2019/0067022 A1* | 2/2019 | Lin | H01L 21/76877 |

\* cited by examiner

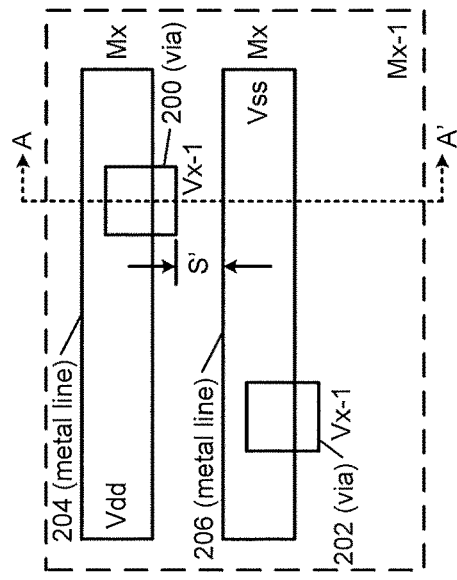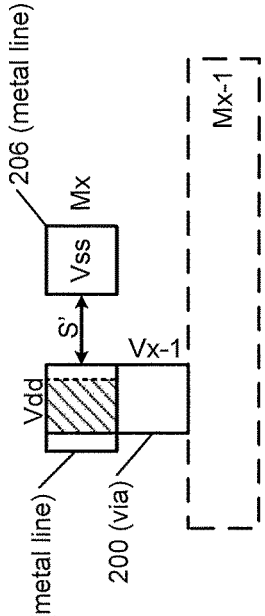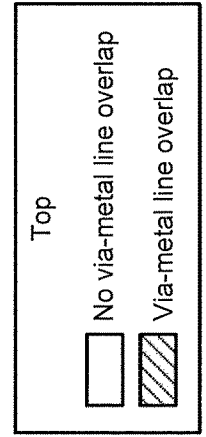
FIG. 1A
Prior Art
FIG. 1B
Prior Art
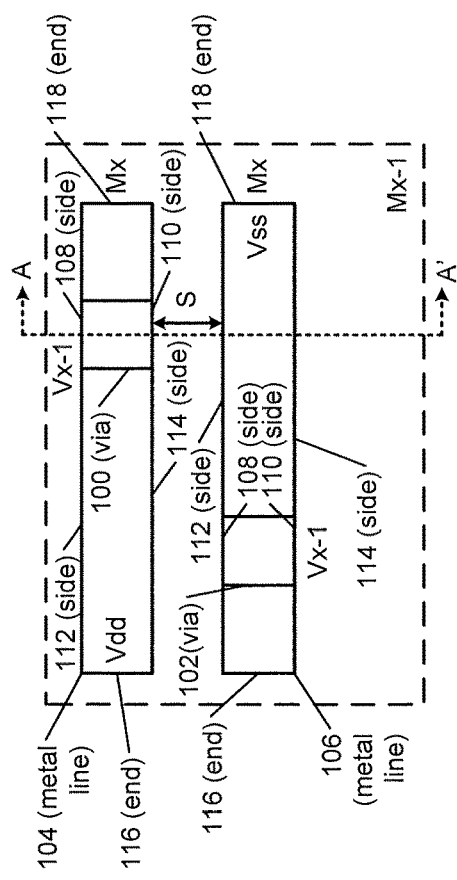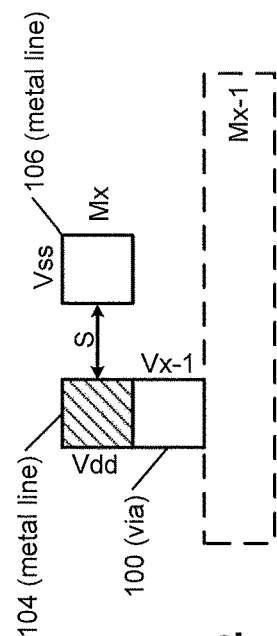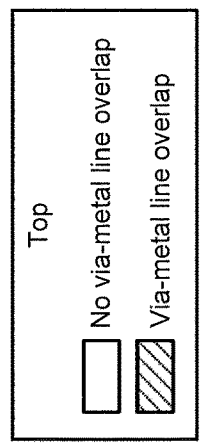
FIG. 2A
Prior Art
FIG. 2B
Prior Art

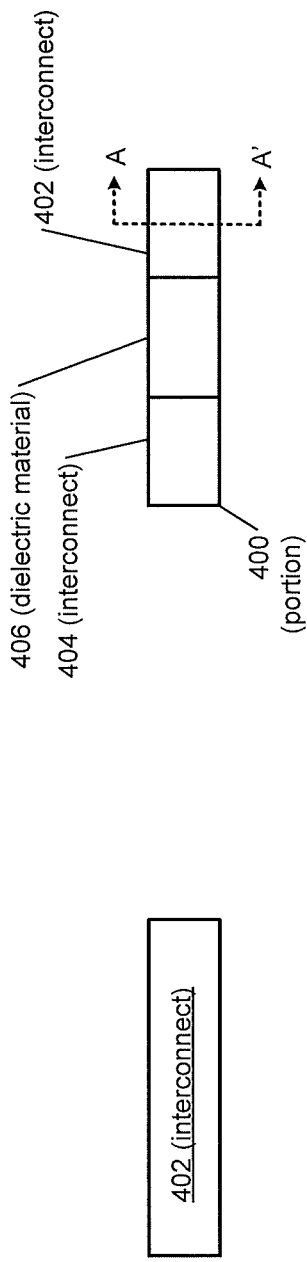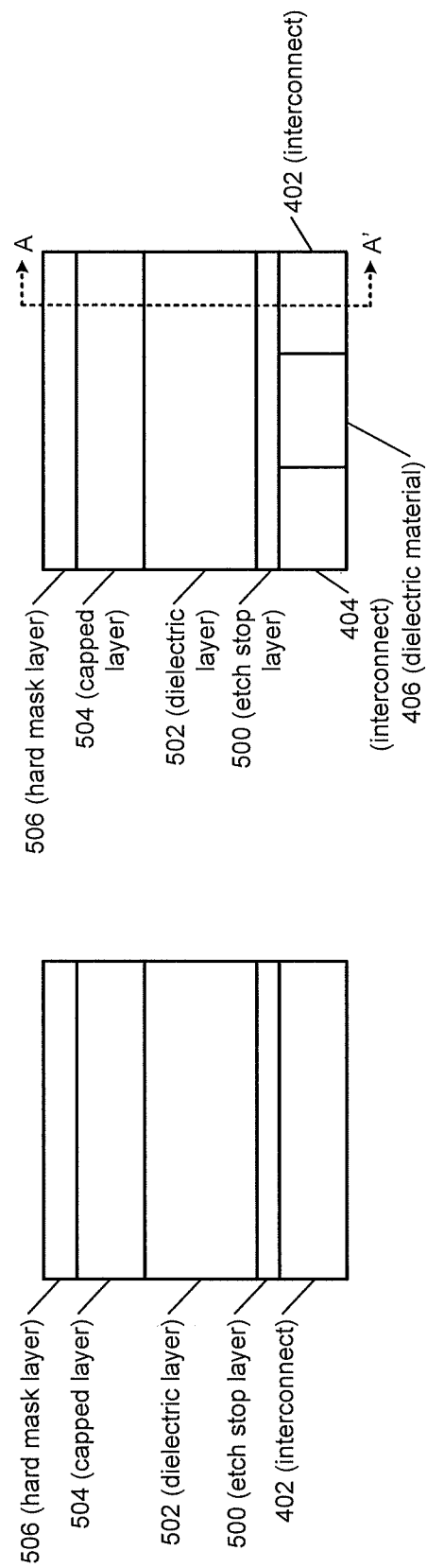

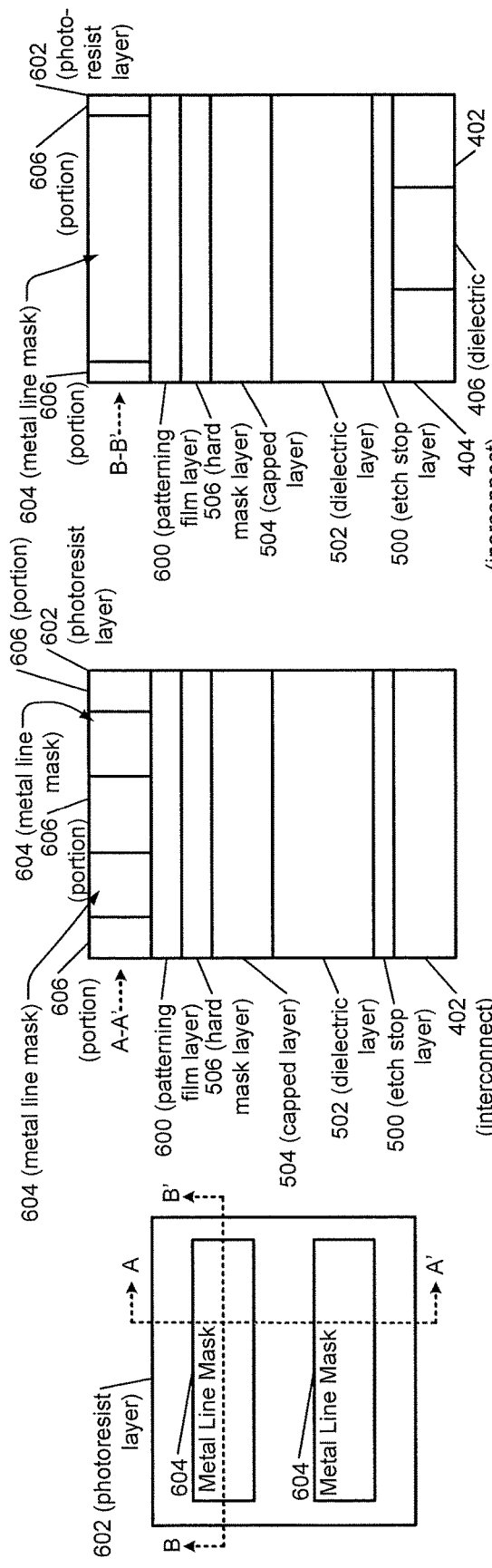
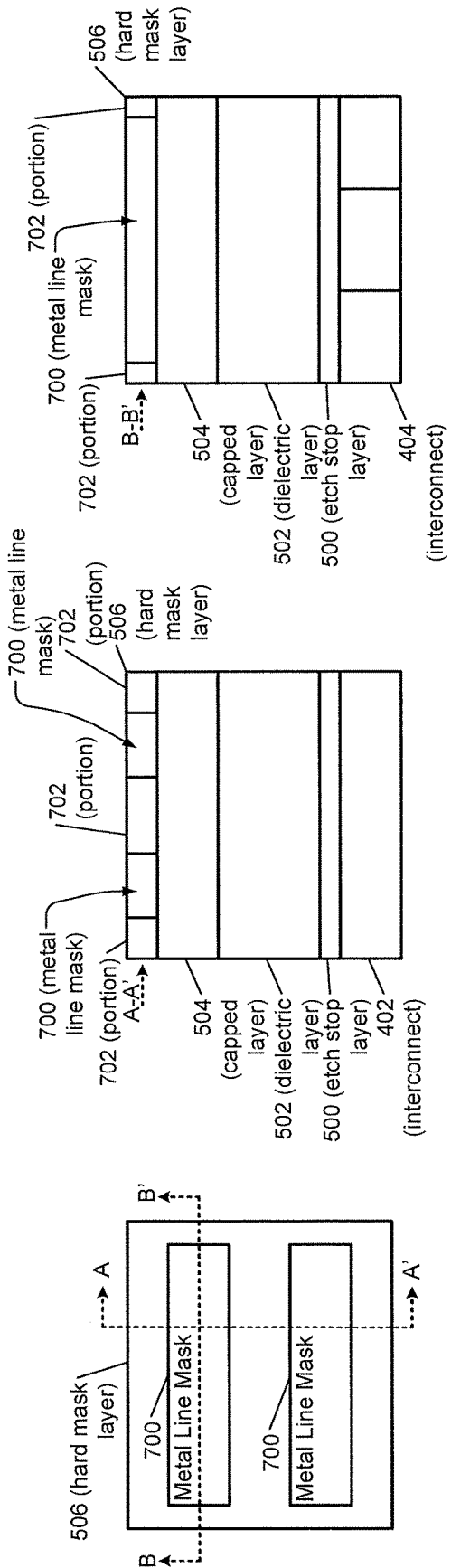

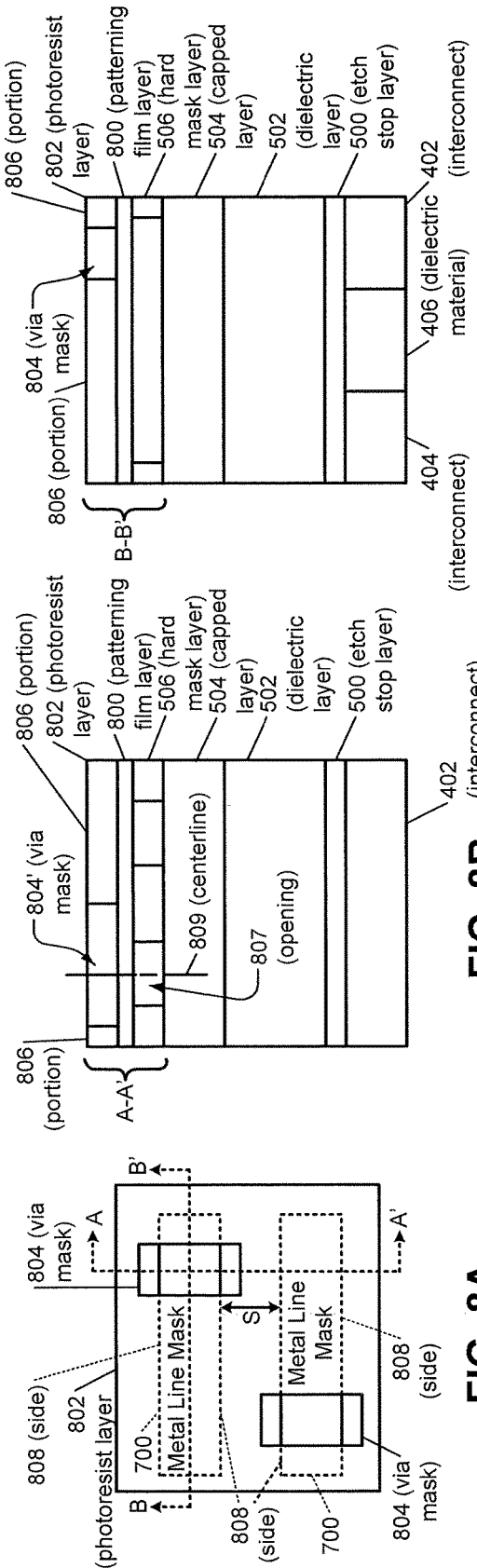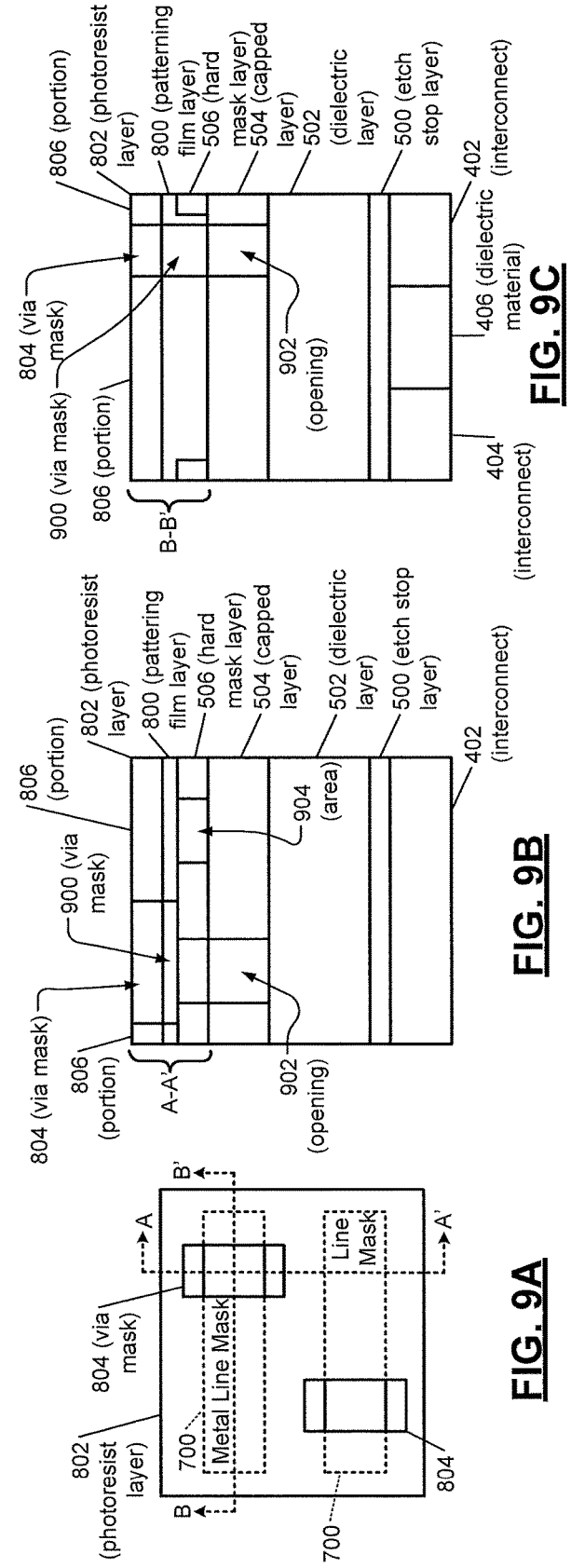

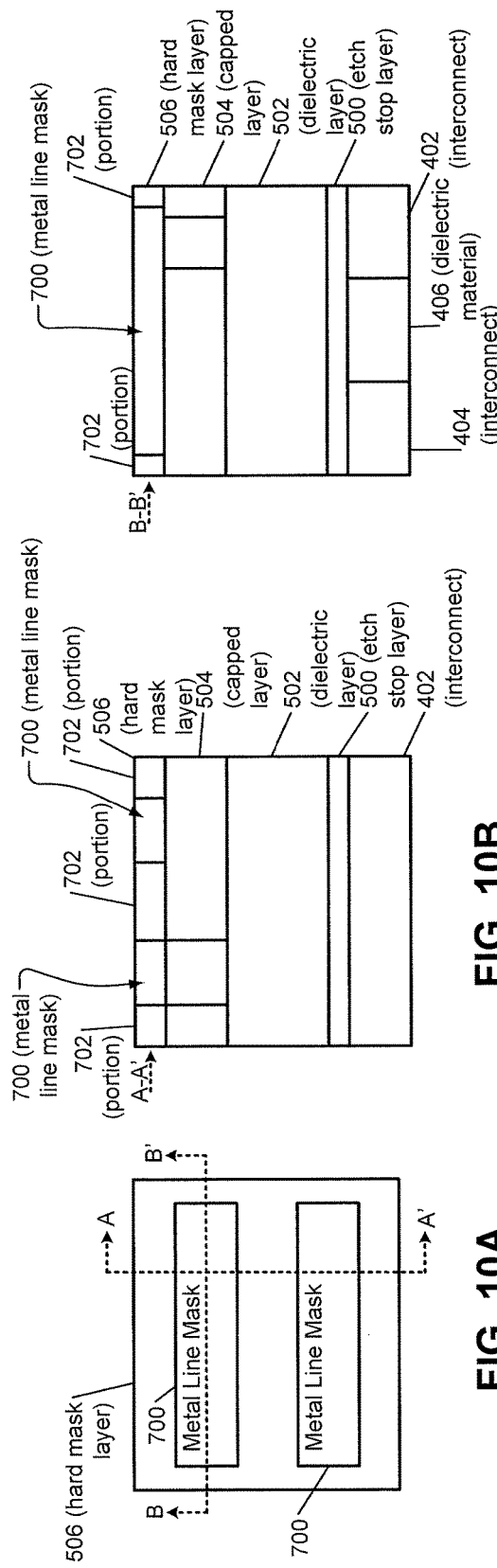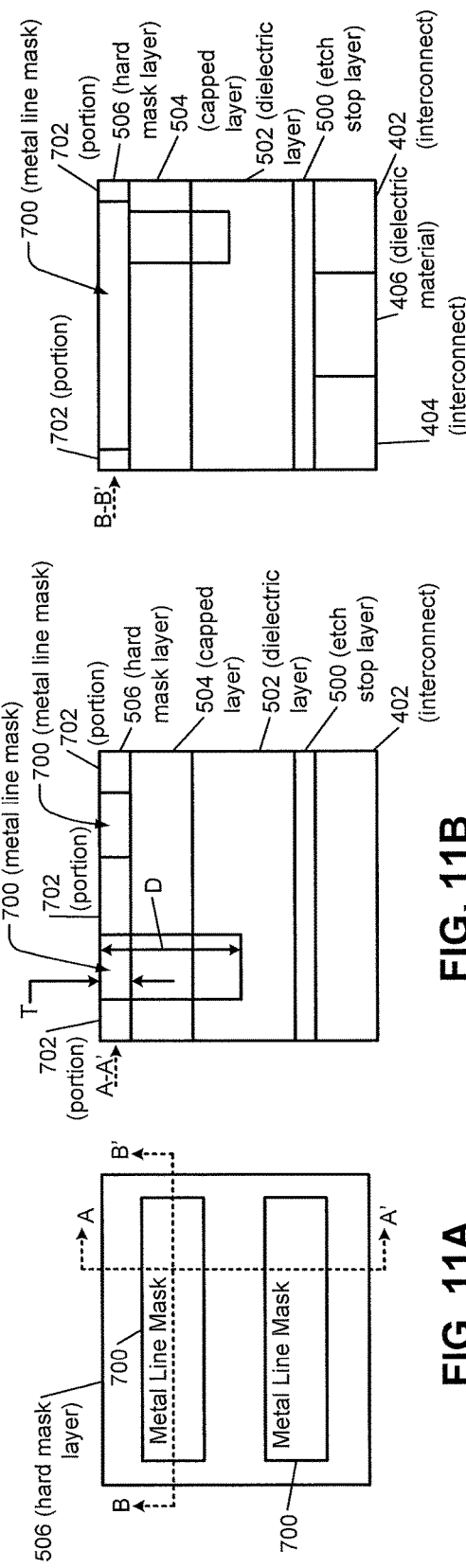

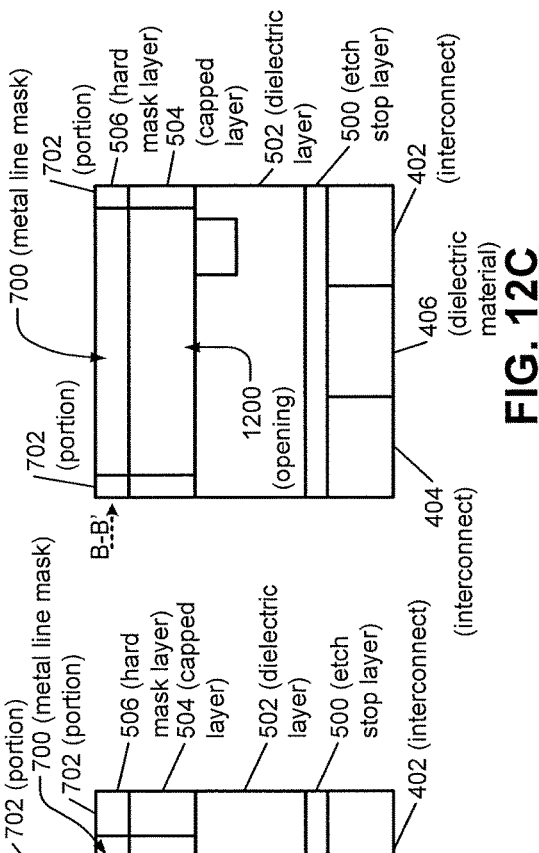
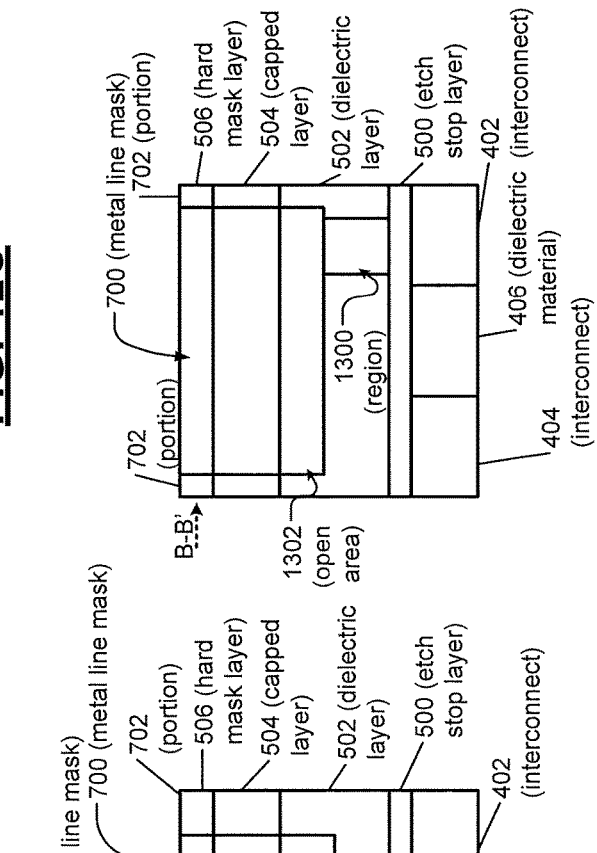
FIG. 12A   FIG. 12B   FIG. 12C
FIG. 13A   FIG. 13B   FIG. 13C

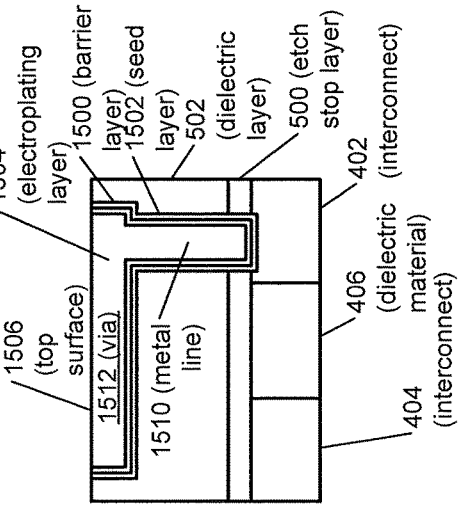
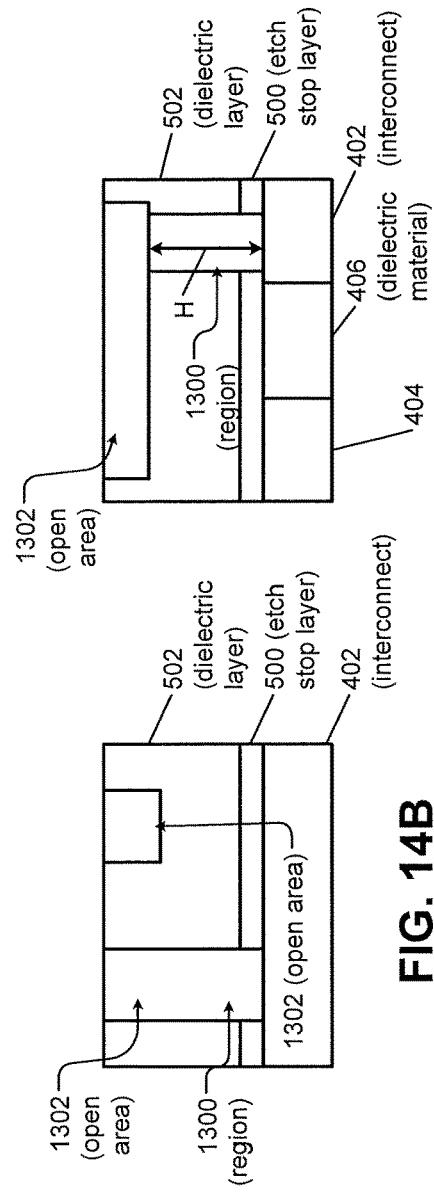
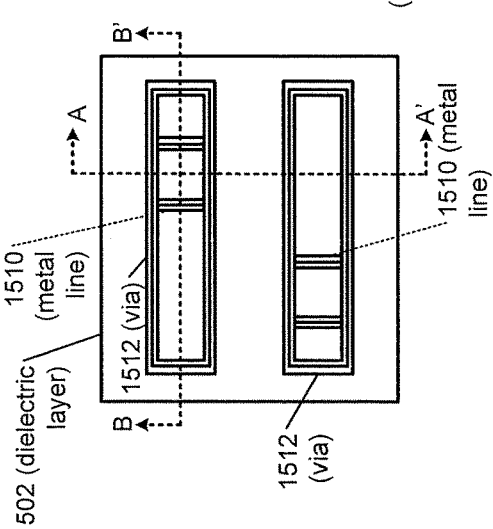
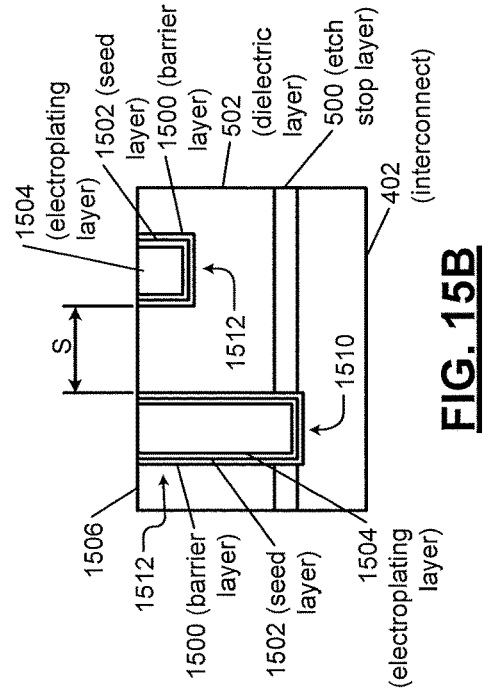
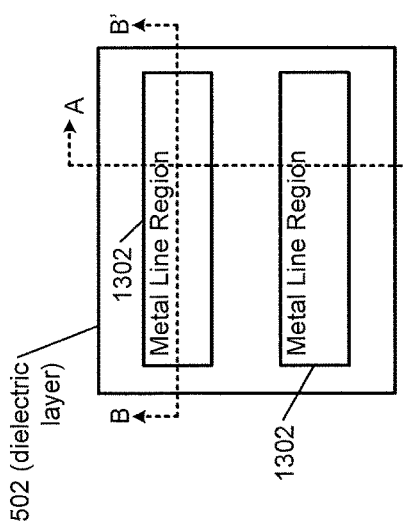

US 11,081,387 B2

CREATING AN ALIGNED VIA AND METAL LINE IN AN INTEGRATED CIRCUIT INCLUDING FORMING AN OVERSIZED VIA MASK

CROSS-REFERENCE TO RELATED APPLICATIONS

The present disclosure is a continuation of U.S. patent application Ser. No. 16/106,205 filed on Aug. 21, 2018 (now U.S. Pat. No. 10,522,394 issued on Dec. 31, 2019). This application claims the benefit of U.S. Provisional Application No. 62/562,846, filed on Sep. 25, 2017. The entire disclosures of the applications referenced above are incorporated herein by reference.

FIELD

The present disclosure relates to manufacturing of integrated circuits, and more particularly to formation of vias in ultra-high density integrated circuits.

BACKGROUND

The background description provided herein is for the purpose of generally presenting the context of the disclosure. Work of the presently named inventors, to the extent the work is described in this background section, as well as aspects of the description that may not otherwise qualify as prior art at the time of filing, are neither expressly nor impliedly admitted as prior art against the present disclosure.

During manufacturing of ultra-high density integrated circuits (UHDICs), such as certain memory chips, metal lines and vias are formed to provide various conductive connections. Pitch between metal lines and vias is typically the smallest pitch between conductive elements of the UHDICs. The metal lines and vias may be formed using a dual damascene process. During the dual damascene process masks are formed for the metal lines and the vias. The masks for the vias can overlay the masks for the metal lines. Due to processing errors, systematic shifts and/or noise, the masks for the vias may not be aligned with the masks for the metal lines. As a result, one or more vias may be spaced closer to one or more of the metal lines, thus further reducing a minimum pitch between metal lines and vias.

This mask layer-to-mask layer overlay error is illustrated by FIGS. 1A-2B, which show metal lines and respective vias. FIGS. 1A and 1B show two vias 100, 102 aligned with two metal lines 104, 106 in a direction in which the metal lines 104, 106 are extending, such that two opposing sides 108, 110 of each of the vias 100, 102 are aligned with two opposing sides 112, 114 of each of the metal lines. The vias 100, 102 are disposed along and between ends 116, 118 of the metal lines 104, 106. The two metal lines 104, 106 may be Vdd and Vss nets (or rails) and are in a same layer Mx. The first metal line 104 may be connected to a voltage supply and be at a voltage Vdd. The second metal line 106 may be connected to a reference terminal (or ground) and have a voltage Vss. The first via 100 may be connected as shown to an interconnect line (not shown), which may be in a layer Mx-1. The aligned metal lines 104, 106 and vias 100, 102 have an associated metal line-to-via pitch S (i.e., distance between each of the metal lines 104, 106 and a corresponding one of the vias 100, 102 that is connected to the other one of the metal lines 104, 106 metal line).

FIGS. 2A and 2B show two vias 200, 202 misaligned relative to two metal lines 204, 206. FIG. 2A shows the vias 200, 202 offset from the metal lines 204, 206 and having associated metal line-to-via pitch of S'. The metal lines 204, 206 are in a same layer Mx. The first via 200 may be connected to a voltage supply and be at a voltage Vdd. The second via 202 may be connected to a reference terminal (or ground) and have a voltage Vss. The first via 200 may be connected to an interconnect line (not shown), which may be in a layer Mx-1.

UHDICs are typically designed to minimize pitch between circuit elements. This includes minimizing spacing between metal lines and vias. The spacing between metal lines and vias may be set based on a photolithography resolution limit. Minimizing the spacing minimizes associated chip area. However, due to the above-stated mask layer-to-mask layer overlay error, the spacing may be further reduced in certain areas. In a deep sub-100 nanometer (nm) process, overlay of masks becomes a large portion of metal line to via edge placement error. Reduced spacing between Vdd and Vss metal lines and vias can result in a short between circuit elements and/or a breakdown over time of dielectric material between the metal lines and vias. A short can result in a functionality failure. A reliability issue exists if the dielectric between the circuit elements breakdown over time (referred to as a time dependent dielectric breakdown (TDDB)).

SUMMARY

A method of forming vias aligned with metal lines in an integrated circuit is provided. The method includes: forming a stack including first layers, where the first layers include a dielectric layer, a capped layer, a hard mask layer, a first film layer, and a first photoresist layer; patterning the first photoresist layer to provide metal line masks; etching the hard mask layer based on the patterned first photoresist layer to form metal line masks in the hard mask layer; ashing the first photoresist layer and the first film layer; and forming second layers on the hard mask layer, where the second layers include a second film layer and a second photoresist layer. The method further includes: patterning the second photoresist layer to form via masks, where the via masks extend across opposing sides of the metal line masks; etching the second film layer and the capped layer based on the patterned second photoresist layer; ashing the second photoresist layer and the second film layer; etching the dielectric layer and the capped layer based on a pattern of the hard mask layer to provide via regions and metal line regions; etching the hard mask layer and the capped layer; and performing dual damascene process operations to form the vias and the metal lines in the via regions and the metal line regions.

In other features, a processing system for processing a substrate and forming vias aligned with metal lines in an integrated circuit is provided. The processing system includes a processor, a memory and one or more applications stored in the memory and including instructions. The instructions are executable by the processor to: form a stack including first layers, where the first layers include a dielectric layer, a capped layer, a hard mask layer, a first film layer, and a first photoresist layer; pattern the first photoresist layer to provide metal line masks; etch the hard mask layer based on the patterned first photoresist layer to form metal line masks in the hard mask layer; and ash the first photoresist layer and the first film layer. The instructions are further executable to: form second layers on the hard mask layer, where the second layers include a second film layer and a second photoresist layer; pattern the second photoresist layer to form via masks, where the via masks extend across opposing sides of the metal line masks; etch the second film layer and the capped layer based on the patterned second photoresist layer; ash the second photoresist layer and the second film layer; etch the dielectric layer and the capped layer based on a pattern of the hard mask layer to provide via regions and metal line regions; etch the hard mask layer and the capped layer; and perform dual damascene process operations to form the vias and the metal lines in the via regions and the metal line regions.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF DRAWINGS

FIG. 1A is a top view of a portion of an IC including aligned metal lines and vias.

FIG. 1B is a cross-sectional view through section line A-A' of FIG. 1A.

FIG. 2A is a top view of misaligned metal lines and vias.

FIG. 2B is a cross-sectional view through section line A-A' of FIG. 2A.

FIG. 4A is a cross-sectional view through section line A-A' and an interconnect of FIG. 4B of an example of a portion of an interconnect layer of the IC being formed in accordance with an embodiment of the present disclosure.

FIG. 4B is a cross-sectional view of an example of a portion of the interconnect layer corresponding to FIG. 4A and taken in a direction perpendicular to the cross-section of FIG. 4A.

FIG. 5A is a cross-sectional view through section line A-A' of FIG. 5A illustrating formation of example etch stop, dielectric, capped, and hard mask layers on the interconnect layer of FIG. 4A.

FIG. 5B is a cross-sectional view taken through the interconnect, etch stop, dielectric, capped and hard mask layers of FIG. 5A and in a direction perpendicular to the cross-section of FIG. 5A.

FIG. 6A is a top view illustrating formation of an example of a first photoresist layer above the hard mask layer of FIGS. 5A-5B to provide metal line masks in accordance with an embodiment of the present disclosure.

FIG. 6B is a cross-sectional view corresponding to section line A-A' of FIG. 6A and illustrating formation of an example of a first patterning film layer and the first photoresist layer including the metal line masks in accordance with an embodiment of the present disclosure.

FIG. 6C is a cross-sectional view corresponding to section line B-B' of FIG. 6A and illustrating formation of one of the metal line masks of FIG. 6B in accordance with an embodiment of the present disclosure.

FIG. 7A is a top view illustrating an example of the hard mask layer of FIGS. 5A-5B etched in accordance with an embodiment of the present disclosure.

FIG. 7B is a cross-sectional view corresponding to section line A-A' of FIG. 7A illustrating the etched hard mask layer and metal line masks and etching away of a remainder of the pattern resist layer and the photoresist layer in accordance with an embodiment of the present disclosure.

FIG. 7C is a cross-sectional view corresponding to section line B-B' of FIG. 7A illustrating the etched hard mask layer, one of the metal line masks and the etching away of a remainder of the first patterning film layer and the first photoresist layer in accordance with an embodiment of the present disclosure.

FIG. 8A is a top view illustrating formation of an example of a second photoresist layer above the etched hard mask layer of FIGS. 7B-7C to provide oversized via masks in accordance with an embodiment of the present disclosure.

FIG. 8B is a cross-sectional view corresponding to section line A-A' of FIG. 8A and illustrating formation of an example of a second patterning film layer and the second photoresist layer of FIG. 8A including one of the oversized via masks on the etched hard mask layer of FIGS. 7B-7C in accordance with an embodiment of the present disclosure.

FIG. 8C a cross-sectional view corresponding to section line B-B' of FIG. 8A and illustrating formation of one of the oversized via masks in accordance with an embodiment of the present disclosure.

FIG. 9A is a top view illustrating the patterning film layer of FIGS. 8B-8C subsequent to etching in accordance with an embodiment of the present disclosure.

FIG. 9B is a cross-sectional view corresponding to section line A-A' of FIG. 9A illustrating the second patterning film layer and the capped layer of FIGS. 8B-8C subsequent to etching.

FIG. 9C is a cross-sectional view corresponding to section line B-B' of FIG. 9A illustrating the second patterning film layer and the capped layer of FIGS. 8B-8C subsequent to etching.

FIG. 10A is a top view illustrating the etched hard mask layer of FIGS. 9B-9C.

FIG. 10B is a cross-sectional view corresponding to second line A-A' of FIG. 10A illustrating the second patterning film layer and the second photoresist layer of FIGS. 9B-9C ashed away in accordance with an embodiment of the present disclosure.

FIG. 10C is a cross-sectional view corresponding to second line B-B' of FIG. 10B illustrating the second patterning film layer and the second photoresist layer of FIGS. 9B-9C ashed away in accordance with an embodiment of the present disclosure.

FIG. 11A is a top view of the etched hard mask layer of FIGS. 9B-9C.

FIG. 11B is a cross-sectional view corresponding to section line A-A' of FIG. 11A illustrating the dielectric layer etched in accordance with an embodiment of the present disclosure.

FIG. 11C is a cross-sectional view corresponding to section line B-B' of FIG. 11A illustrating the dielectric layer etched in accordance with an embodiment of the present disclosure.

FIG. 12A is a top view of the etched hard mask layer of FIGS. 9B-9C.

FIG. 12B is a cross-sectional view corresponding to section line A-A' of FIG. 12A illustrating the capped layer etched in accordance with an embodiment of the present disclosure.

FIG. 12C is a cross-sectional view corresponding to section line B-B' of FIG. 12A illustrating the capped layer etched in accordance with an embodiment of the present disclosure.

FIG. 13A is a top view of the etched hard mask layer of FIGS. 9B-9C.

FIG. 13B is a cross-sectional view corresponding to section line A-A' of FIG. 13A illustrating the dielectric layer etched in accordance with an embodiment of the present disclosure.

FIG. 13C is a cross-sectional view corresponding to section line B-B' of FIG. 13A illustrating the dielectric layer etched in accordance with an embodiment of the present disclosure.

FIG. 14A is a top view of the dielectric layer illustrating line openings for metal lines in accordance with an embodiment of the present disclosure.

FIG. 14B is a cross-sectional view of the dielectric layer, the etch stop layer and the interconnect layer of FIGS. 13B-13C illustrating the etch stop layer etched in accordance with an embodiment of the present disclosure.

FIG. 14C is a cross-sectional view of the dielectric layer, the etch stop layer and the interconnect layer of FIGS. 13B-13C taken in a direction perpendicular to the cross-section of FIG. 14B and illustrating the etch stop layer etched in accordance with an embodiment of the present disclosure.

FIG. 15A is a top view of the dielectric layer illustrating formed barrier, seed and electroplating layers providing the metal lines in accordance with an embodiment of the present disclosure.

FIG. 15B is a cross-sectional view of the dielectric layer, the etch stop layer and the interconnect layer of FIGS. 14A-14C illustrating the formed barrier, seed and electroplating layers and a planarized top surface provided from chemical mechanical planarization of certain layers in accordance with an embodiment of the present disclosure.

FIG. 15C is a cross-sectional view of the dielectric layer, the etch stop layer and the interconnect layer of FIGS. 14A-14C taken in a direction perpendicular to the cross-section of FIG. 15B and illustrating the formed barrier, seed and electroplating layers and the planarized top surface provided from chemical mechanical planarization of certain layers in accordance with an embodiment of the present disclosure.

In the drawings, reference numbers may be reused to identify similar and/or identical elements.

DESCRIPTION

Functionality and reliability issues associated with metal line-to-via spacing may be prevented by increasing design spacing (or pitch) between metal lines and vias. This can however increase area utilized by circuit elements, increase size and costs of associated ICs, cause introduction of additional qualifications in design, and increase overlay management and logistic complexity.

The examples set forth herein include methods of aligning stacked portions of vias and aligning vias to metal lines. The methods include introducing hard mask layers, providing via mask layers patterned and shaped differently than traditional via mask layers, and other unique processing operations. The methods eliminate misalignment errors between metal lines and vias and thus allow a corresponding pitch between metal lines and vias to be minimized. The pitches may be minimized to a photolithography resolution limit. As a result, chip size, cost, and corresponding functionality and reliability issues are minimized. The methods include determining and adjusting dimensions of via masks without impacting metal line-to-via (or metal-to-metal) spacing. The via masks are oversized in a direction perpendicular to a direction at which a corresponding metal line is extending. This assures removal of patterning film layers over etched away portions of the hard mask layers for proper etching of dielectric layers for aligned via formation.

Figure 3:
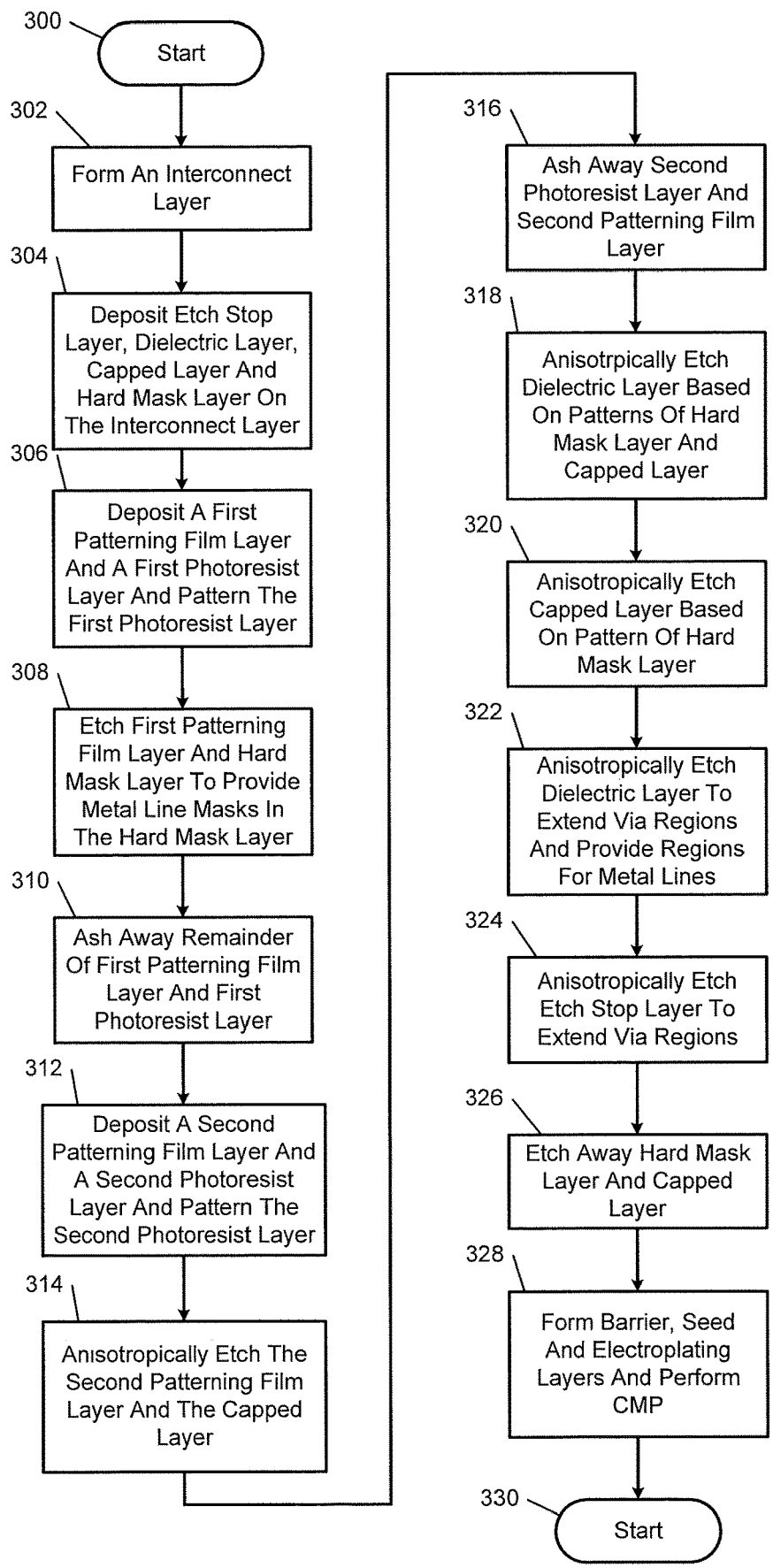
FIG. 3 illustrates a method of forming aligned vias of an IC in accordance with an embodiment of the present disclosure.

FIG. 3 illustrates a method of forming aligned vias and/or other conductive elements of an IC. The method may be referred to as a type of dual damascene process, but includes operations not traditionally performed during a dual damascene process. The method may be performed by the example processing system of FIG. 18 or by another suitable processing system. The operations may be controlled and timed by the control module of FIGS. 18-19. This method may be performed while manufacturing ICs and/or corresponding layers of the ICs. In an embodiment, the method includes aligning portions of vias and aligning the vias to metal lines. The method includes forming and shaping via masks and layer stacks to provide aligned vias. The method allows for via mask overlay error while providing aligned vias, which decreases chip and system yield losses during manufacturing of ICs. At least some of the operations that may be performed during this method are illustrated in FIGS. 4A-15B.

The method may begin at 300. At 302, an interconnect layer and/or other layer to which vias and/or metal lines may extend to and/or terminate is formed. FIGS. 4A-4B show a portion 400 of the interconnect layer of an IC being formed. The portion 400 includes interconnects 402, 404. The interconnects 402, 404 are separated by dielectric material 406.

At 304, multiple non-conductive layers including an etch stop layer 500, a dielectric layer 502, a capped layer 504, and a hard mask layer 506 are formed as an example on the interconnect layer at 302. FIGS. 5A-5B show formation of the layers 500, 502, 504, and 506 on the portion 400 of FIG. 4A. The dielectric layer 502 may be a low permittivity (low-k) dielectric film. In an embodiment, the permittivity k of the dielectric layer 502 is greater than 1 and less than 2.7 Farads per meter (F/m). As an example, the dielectric layer 502 may be formed of carbon doped silicon oxide $SiO_2$. The capped layer 504 may be a dielectric film layer formed of a different material than the dielectric layer 502. As an example, the capped layer 504 may be formed of silicon nitride $Si_3N_4$. As an example, the hard mask layer 506 may be formed of titanium nitride TiN.

At 306, a first patterning film layer 600 and a first photoresist layer 602 is formed. FIGS. 6A-6C shown formation of the layers 600, 602 including metal line masks 604 on the hard mask layer of FIGS. 5A-5B. The metal line masks 604 are open areas between portions 606 of the photoresist layer 602. In an embodiment, the patterning film layer 600 is formed of amorphous silicon and/or an anti-reflective coating film. The photoresist layer 602 may be spun on and is patterned using photolithography to provide the metal line masks 604 (shown as trenches), which are used in a following operation to etch the hard mask layer 506.

At 308, exposed portions of the first patterning film layer 600 and the hard mask layer 506 are etched using a first composition of etching material (e.g., tetrafluoromethane (CF$_4$)-oxygen (O$_2$) plasma) in areas below the metal line masks 604 to provide metal line openings (or masks) 700 in the hard mask layer 506. The openings 700 are between portions 702 of the hard mask layer 506. The etching is stopped on a top surface of the capped layer 504. At 310, the remainder of the first patterning film layer 600 and the first photoresist layer 602 are ashed way. FIGS. 7A-7C show the etched hard mask layer 506 and metal line masks 604 and etching away of a remainder of the first patterning film layer 600 and the first photoresist layer 602.

At 312, a second patterning film layer 800 and a second photoresist layer 802 are formed on the hard mask layer 506 and the capped layer 504. FIGS. 8A-8C show formation of the second patterning film layer 800 and the second photoresist layer 802 including oversized via masks 804 on the etched hard mask layer 506 of FIGS. 7B-7C. The second patterning film layer 800 may be formed of amorphous silicon and/or an anti-reflective coating film. The second photoresist layer 802 may be spun on and is patterned using photolithography to provide the via masks 804. The via masks 804 are oversized and used in a following operation to etch the second patterning film layer 800 and the capped layer 504. The via masks 804 are open areas between portions 806 of the second photoresist layer 802. The via masks 804 may or may not be centered over respective openings in the hard mask layer 506. For example, the via mask 804' is shown in FIG. 8B as not being centered over opening 807 in the hard mask layer 506. As shown in FIG. 8B, the via mask 804' is offset to the right of a centerline 809 of the opening 807. The oversizing of the via masks 804 allows for errors in centering the via masks 804 over the corresponding metal line masks in the hard mask layer 506.

The via masks 804 are shaped to extend over opposing sides 808 of the line masks 700. Each of the via masks 804 extends perpendicular to one of the metal line masks and over each opposing side 808 (or edge) of that metal line mask. The via masks 804 extend in a direction that is sensitive to via alignment errors, such as the errors shown in FIGS. 2A and 2B. As shown, each of the via masks 804 may extend across one of the metal line masks and over portions of the hard mask layer 506. In an embodiment, the via masks 804 extend past the sides 808 an amount greater than 0 and less than or equal to 50% of a distance S between the metal line masks (i.e., pitch between to be created metal lines). The via masks open areas of targeted vias in the IC being formed. This process provides overlay error tolerance (or extra margin for overlay errors) during dual damascene process operations.

At 314, exposed portions of the second patterning film layer 800 and the capped layer 504 are anisotropically etched based on the patterned second photoresist layer 802 and the second patterning film layer 800 following the via mask formed at 312. Anisotropically etching includes directional plasma dry etching in only a vertical direction (or direction, for example, perpendicular to a plane extending between two adjacent ones of the layers 500, 502, 504 and 506). This etching may include use of a second composition of etching material (e.g., nitrogen trifluoride (NF$_3$)-oxygen (O$_2$) plasma) different than the first composition. FIGS. 9A-9C show the patterning film layer 800 and the capped layer 504 of FIGS. 8B-8C in an etched state. The anisotropical etching provides oversized via openings (or masks) 900 in the second patterning film layer 800 and a via openings 902 in the capped layer 504. The pattern of the etched hard mask layer 506 is used to align the via openings 902 in the capped layer 504. The etching is stopped at a top surface of the dielectric layer 502. The capped layer 504 is not etched in areas (e.g., area 904) below openings (or masks) in the hard mask layer 506 that are covered by the second patterning film layer 800 and the second photoresist layer 802.

At 316, the second photoresist layer 802 and the second patterning film layer 800 are ashed away. FIGS. 10A-10C show the second patterning film layer 800 and the second photoresist layer 802 of FIGS. 9B-9C removed from the hard mask layer 506. The layers 502, 504 and 506 remain subsequent to performing this ashing process.

At 318, exposed portions of the dielectric layer 502 is anisotropically etched based on patterns of the hard mask layer 506 and the capped layer 504. FIGS. 11A-11C shows the dielectric layer 502 anisotropically etched. The hard mask layer 506 and the capped layer 504 are each used as a mask layer. The hard mask layer 506 may be referred to as a first mask layer and the capped layer 504 may be referred to as a second mask layer. The dielectric layer 502 is anisotropically etched in areas below the previous removed areas of the hard mask layer 506 and the capped layer 504, as shown. A third composition of etching material (e.g., fluoroform (CHF$_3$) plasma) is used to etch the dielectric layer 502. The third composition may be different than the first composition and second composition. The stack of layers during this operation are etched to a depth, such that the depth D of the corresponding trench is equal to a height H of a via to be formed minus the thickness T of the hard mask layer 506. The depth D and the thickness T are shown in FIG. 11A and the height H is shown in FIG. 14C.

At 320, exposed portions of the capped layer 504 are anisotropically etched based on the pattern of the hard mask layer 506. A fourth composition of etching material (e.g., nitrogen trifluoride (NF$_3$)-oxygen (O$_2$)-argon (Ar) plasma) may be used to etch the capped layer 504. FIGS. 12A-12C the capped layer 504 with additional etched away portions. The fourth composition of etching material may be different than the first composition, second composition and third composition. The openings created by this etching in the capped layer 504 are designated 1200. The dielectric layer 502 is not etched during this operation.

At 322, the dielectric layer 502 is further etched based on the patterns of the hard mask layer 506 and the capped layer 504. FIGS. 13A-13C show the dielectric layer 502 subsequent to this etching. A fifth composition of etching material (e.g., fluoroform (CHF$_3$) plasma) may be used to etch the dielectric layer 502. The fifth composition may match or be different than the third composition of etching material. The fifth composition may be different than the first composition and second composition. The dielectric layer 502 is etched until via regions 1300 reach a top surface of the etch stop layer 500. This etching of the dielectric layer 502 also provides open areas, such as open area 1302, for metal lines to be formed during a subsequent operation.

At 324, the etch stop layer 500 is anisotropically etched based on a pattern of the hard mask layer 506, a pattern of the capped layer 504 and/or a pattern of the dielectric layer 502 to extend via regions. A sixth composition of etching material (e.g., hexafluoroethane (C$_2$F$_6$)-oxygen (O$_2$)-argon (Ar) plasma) may be used to perform this etching process. FIGS. 14A-14C show the dielectric layer 502, the etch stop layer 500 and the interconnect layer 402 of FIGS. 13B-13C illustrating the etch stop layer subsequent to etching. The fifth composition of etching material may be different than the first composition, second composition, third composition, fourth composition, and fifth composition. At 326, the hard mask layer 506 and the capped layer 504 are etched away. This may include applying a seventh composition of etching material (e.g., tetrafluoromethane ($CF_4$)-oxygen ($O_2$) plasma) and then an eighth composition of etching material (e.g., nitrogen trifluoride ($NF_3$)-oxygen ($O_2$) plasma). The seventh composition and the eighth composition may be different than the first composition, second composition, third composition, fourth composition, fifth composition and sixth composition. The dielectric layer 502 is not etched during operations 324 and 326.

Although shown as a single operation, operation 328 includes multiple operations, which are performed to complete the dual damascene process. At 328, a barrier layer 1500 (e.g., a layer of titanium nitride TiN), a seed layer 1502, and an electroplating layer 1504 are formed in the via regions 1300 and the metal line regions 1302. FIGS. 15A-15C show the dielectric layer 502, the etch stop layer 500 and the interconnect layer 402 of FIGS. 14A-14C illustrating formation of the layers 1500, 1502, 1504 and chemical mechanical planarization (CMP) of the dielectric layer 502 and the electroplating layer 1504. The seed layer 1502 may be formed over the barrier layer 1500. Electroplating is then performed to fill remainders of the via regions 1300 and the metal line regions 1302 not filled by the barrier layer 1500 and the seed layer 1502 to provide the electroplating layer 1504. The seed layer 1502 and the electroplating layer 1504 may be formed of a same or different material and/or composition of materials. Following electroplating, CMP may be performed to remove a top portion of the resulting stack and provide a planar overall top surface 1506. The resulting stack includes metal lines 1510 and vias 1512.

The resulting stack provided as shown in FIGS. 14B-14C includes spacing between metal line regions and via regions that allow for the formation of the seed layer 1502 and the electroplating layer 1504 to form metal lines and vias having a predetermined minimum pitch S. The predetermined minimum pitch S is provided without alignment errors between the metal lines and vias. This allows a designer to minimize the pitch S to be based on for example a photolithography resolution limit. This eliminates reliability errors. The method may end at 330.

The above-described method may be applied to high-density memory chips, high density ICs, and/or other applications where a minimum pitch is to be provided between circuit elements, logic circuit elements, analog circuit blocks, digital circuit blocks, etc. Although the above-described method is described with respect to aligning vias to metal lines, the described alignment may be applied when aligning interconnects to contacts (e.g., underlying slotted contacts) and/or when aligning other circuit elements.

The above-described operations are meant to be illustrative examples. The operations may be performed sequentially, synchronously, simultaneously, continuously, during overlapping time periods or in a different order depending upon the application. Also, any of the operations may not be performed or skipped depending on the implementation and/or sequence of events.

The above-described method includes forming oversized via masks to allow for overlay errors in masks and formation of conductive elements, such as metal lines, vias, interconnects, contacts, etc. The method is scalable to different generations of chip technologies and allows for smaller chip areas and thus size and costs of ICs.

Figure 16:
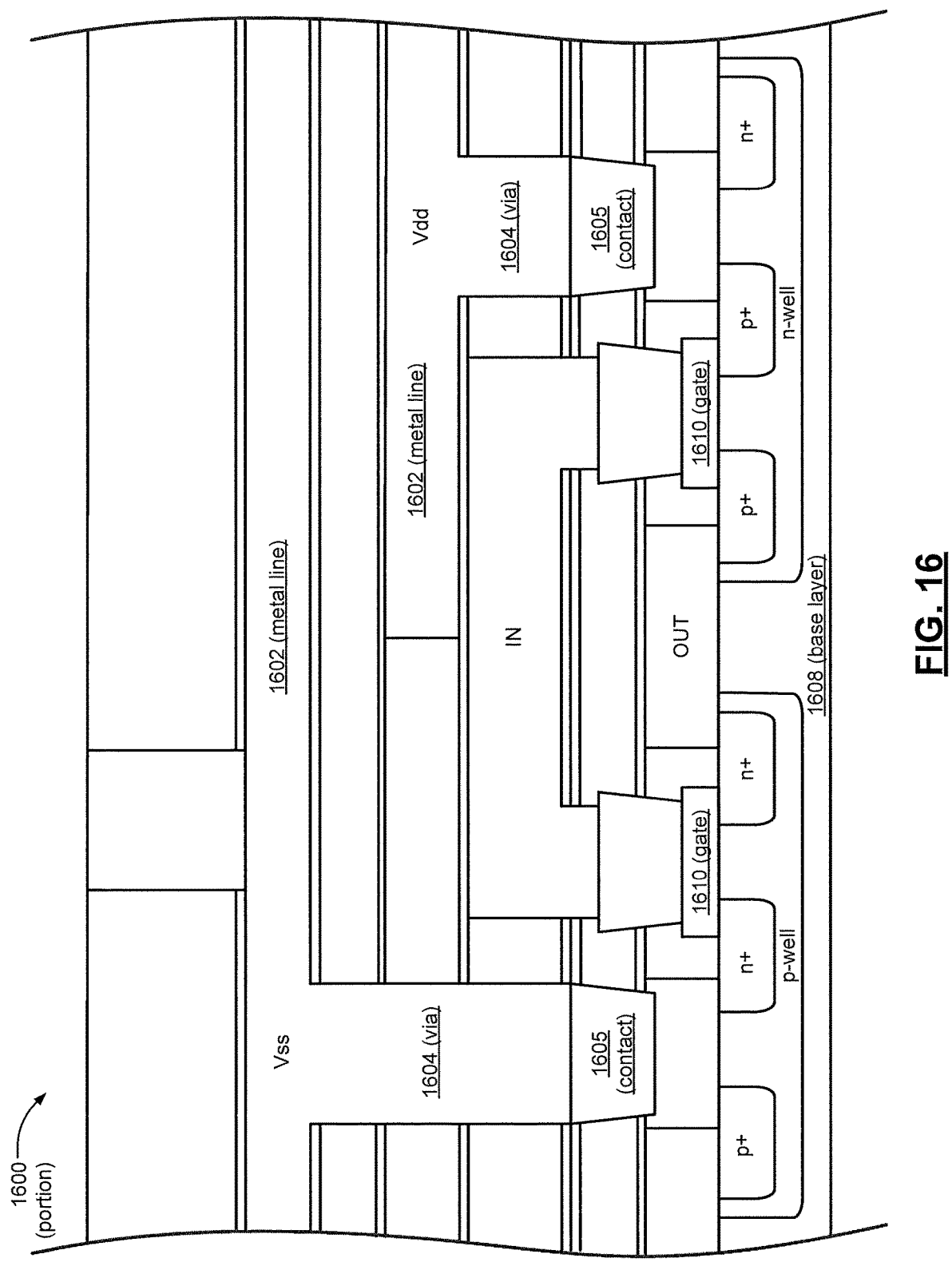
FIG. 16 is an example of a portion of an IC including metal lines and aligned vias formed in accordance with an embodiment of the present disclosure.

FIG. 16 is an example of a portion 1600 of an IC including metal lines 1602 and aligned vias 1604 formed in accordance with the above-described method. In the example shown, two of the metal lines 1602 are connected respectively to a power supply and a reference terminal. The vias 1604 may be connected to interconnects or contacts 1605.

The power supply provides a supply voltage Vdd. The reference terminal is at a voltage potential Vss. As shown, the via 1604 may be connected to $p^+$ and $n^+$ doped regions of a complementary metal-oxide-semiconductor (CMOS) inverter circuit including a p-channel metal-oxide-semiconductor (PMOS) transistor and a n-channel metal-oxide-semiconductor (NMOS) transistor. P-well and n-well regions of the transistors may be disposed in a base (or bottom most) layer 1608. The CMOS inverter circuit may be implemented in, for example, a high-density memory. The transistors have gates 1610. An example, of a six-transistor static random-access memory (SRAM) cell, which may include the CMOS inverter circuit and corresponding stack, is shown in FIG. 17.

Figure 17:
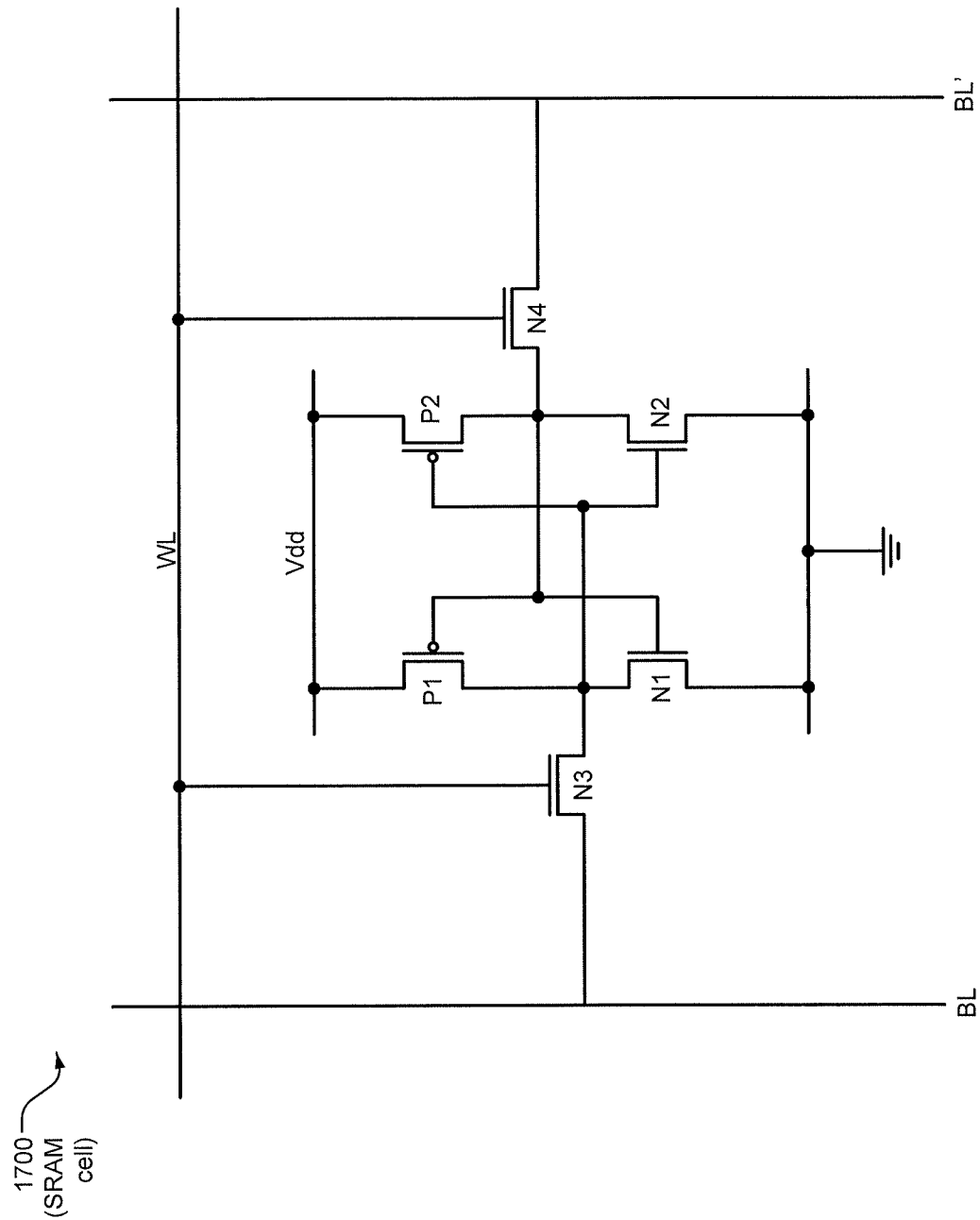
FIG. 17 is an example of a six-transistor static random-access memory cell formed in accordance with an embodiment of the present disclosure.

FIG. 17 shows a six-transistor SRAM cell 1700 of a SRAM memory. The six-transistor SRAM memory cell 1700 includes: a wordline WL; bitlines BL, BL'; CMOS inverter circuits including respectively transistors P1, N1 and P2, N2; and NMOS transistors N3, N4. The transistors P1, P2 are connected to a power supply and have source terminals at Vdd. The transistors N1, N2 are connect the reference terminal and have source terminals at Vss.

Figure 18:
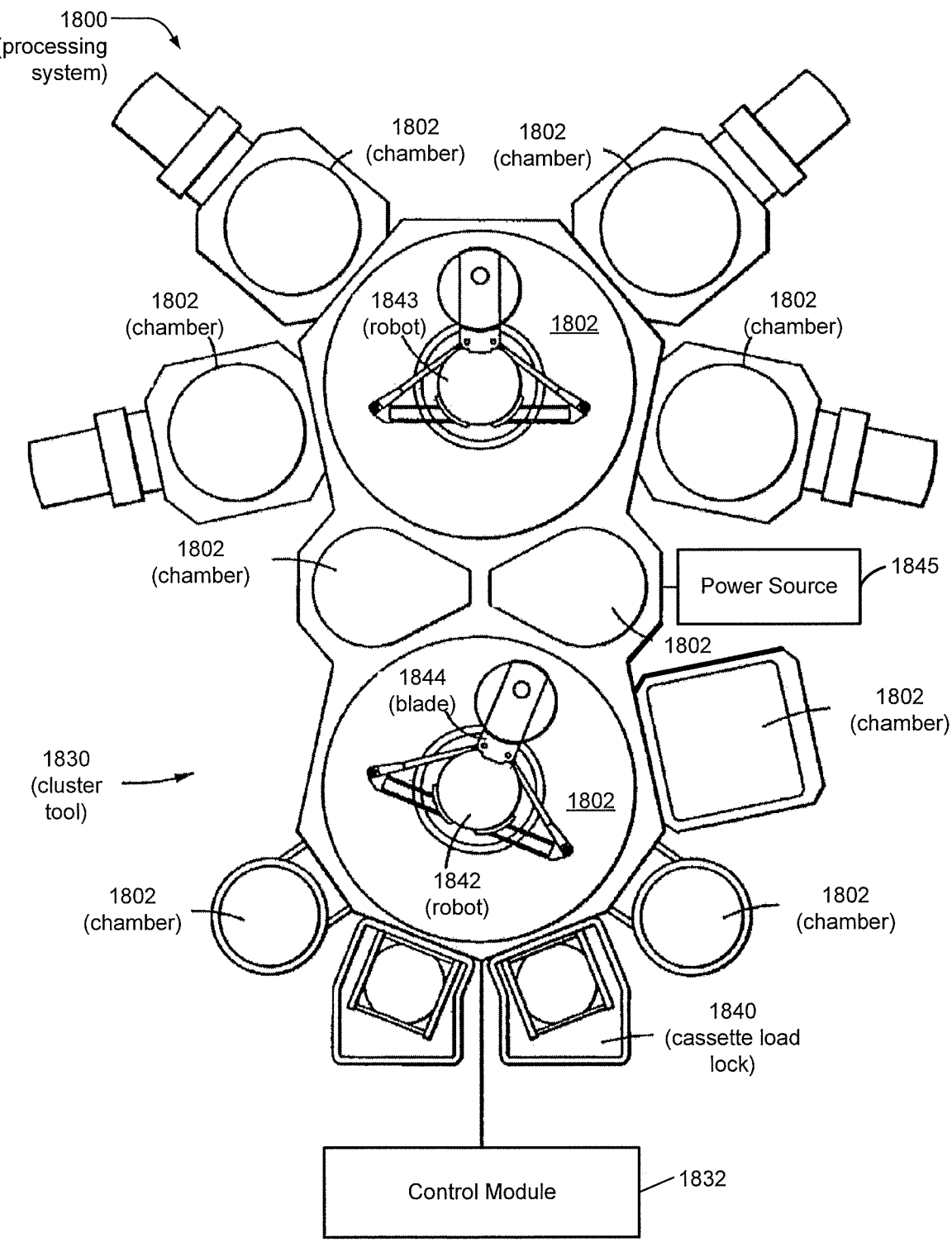
FIG. 18 is an example of a processing system configured to perform the method of FIG. 3 in accordance with an embodiment of the present disclosure.

FIG. 18 shows a processing system 1800 configured to perform the method of FIG. 3. The processing system 1800 may include various chambers 1802 and a cluster tool 1830 programmed to process a substrate according to the method of FIG. 3. Each of the chambers 1802 may be used to perform one or more of the operations in the described process. The arrangement and combination of chambers may be altered for purposes of performing operations of a fabrication process. The cluster tool 1830 is preferably equipped with a control module 1832 programmed to carry out the method of FIG. 3. In order to begin the process, a substrate is introduced through a cassette loadlock 1840. Robots 1842, 1843 may have blades (e.g., a blade 1844) that transfer the substrate between the chambers 1802. The processing system 1800 may receive power from a power source 1845.

Figure 19:
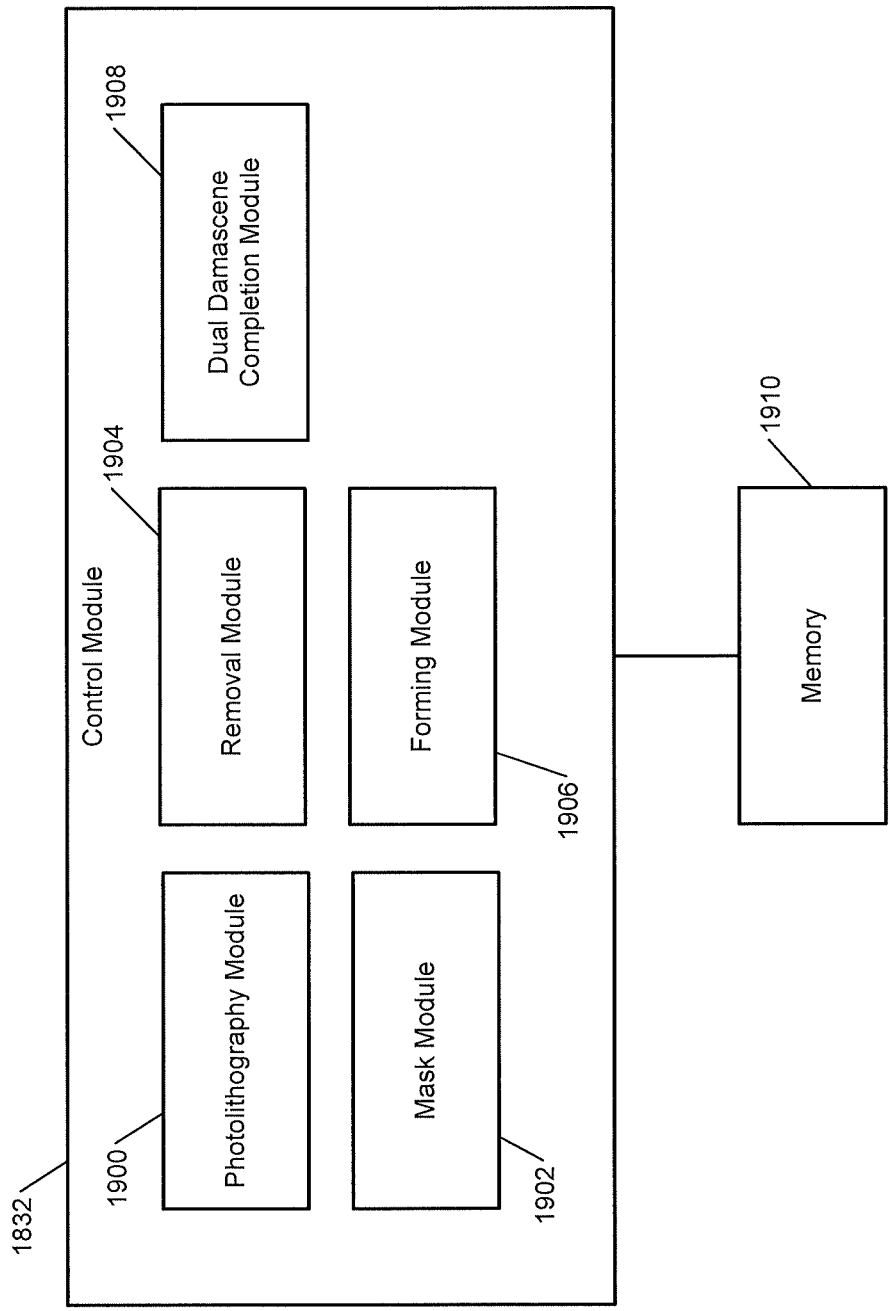
FIG. 19 is an example of a control module in accordance with an embodiment of the present disclosure.

FIG. 19 shows an example of the control module 1832. The control module 1832 may include a photolithography module 1900, a mask module 1902, a removal module 1904, a forming module 1906, a dual damascene completion module 1908, and/or other modules to perform the operation of the method of FIG. 3. As an example, the photolithography module 1900 may perform operations 306, 312. The mask module 1902 may perform operations 308, 314. The removal module 1904 may perform operations 310, 316. The forming module 1906 may perform operations 302, 304, 318, 320, 322, 324, 326. The dual damascene completion module 1907 may perform operation 328. The control module 1832 may execute one or more applications stored in a memory 1910. In one embodiment, the modules 1900, 1902, 1903, 1906 and 1908 are implemented as applications executed by the control module 1832.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. It should be understood that one or more steps within a method may be executed in different order (or concurrently) without altering the principles of the present disclosure. Further, although each of the embodiments is described above as having certain features, any one or more of those features described with respect to any embodiment of the disclosure can be implemented in and/or combined with features of any of the other embodiments, even if that combination is not explicitly described. In other words, the described embodiments are not mutually exclusive, and permutations of one or more embodiments with one another remain within the scope of this disclosure.

Spatial and functional relationships between elements (for example, between modules, circuit elements, semiconductor layers, etc.) are described using various terms, including "connected," "engaged," "coupled," "adjacent," "next to," "on top of," "above," "below," and "disposed." Unless explicitly described as being "direct," when a relationship between first and second elements is described in the above disclosure, that relationship can be a direct relationship where no other intervening elements are present between the first and second elements, but can also be an indirect relationship where one or more intervening elements are present (either spatially or functionally) between the first and second elements. As used herein, the phrase at least one of A, B, and C should be construed to mean a logical (A OR B OR C), using a non-exclusive logical OR, and should not be construed to mean "at least one of A, at least one of B, and at least one of C."

In the figures, the direction of an arrow, as indicated by the arrowhead, generally demonstrates the flow of information (such as data or instructions) that is of interest to the illustration. For example, when element A and element B exchange a variety of information but information transmitted from element A to element B is relevant to the illustration, the arrow may point from element A to element B. This unidirectional arrow does not imply that no other information is transmitted from element B to element A. Further, for information sent from element A to element B, element B may send requests for, or receipt acknowledgements of, the information to element A.

In this application, including the definitions below, the term "module" or the term "controller" may be replaced with the term "circuit." The term "module" refers to: an Application Specific Integrated Circuit (ASIC); a digital, analog, or mixed analog/digital discrete circuit; a digital, analog, or mixed analog/digital integrated circuit; a combinational logic circuit; a field programmable gate array (FPGA); a processor circuit (shared, dedicated, or group) that executes code; a memory circuit (shared, dedicated, or group) that stores code executed by the processor circuit; other suitable hardware components that provide the described functionality; or a combination of some or all of the above, such as in a system-on-chip.

The module may include one or more interface circuits. In some examples, the interface circuits may include wired or wireless interfaces that are connected to a local area network (LAN), the Internet, a wide area network (WAN), or combinations thereof. The functionality of any given module of the present disclosure may be distributed among multiple modules that are connected via interface circuits. For example, multiple modules may allow load balancing. In a further example, a server (also known as remote, or cloud) module may accomplish some functionality on behalf of a client module.

The term code, as used above, may include software, firmware, and/or microcode, and may refer to programs, routines, functions, classes, data structures, and/or objects. The term shared processor circuit encompasses a single processor circuit that executes some or all code from multiple modules. The term group processor circuit encompasses a processor circuit that, in combination with additional processor circuits, executes some or all code from one or more modules. References to multiple processor circuits encompass multiple processor circuits on discrete dies, multiple processor circuits on a single die, multiple cores of a single processor circuit, multiple threads of a single processor circuit, or a combination of the above. The term shared memory circuit encompasses a single memory circuit that stores some or all code from multiple modules. The term group memory circuit encompasses a memory circuit that, in combination with additional memories, stores some or all code from one or more modules.

The term memory circuit is a subset of the term computer-readable medium. The term computer-readable medium, as used herein, does not encompass transitory electrical or electromagnetic signals propagating through a medium (such as on a carrier wave); the term computer-readable medium may therefore be considered tangible and non-transitory. Non-limiting examples of a non-transitory, tangible computer-readable medium are nonvolatile memory circuits (such as a flash memory circuit, an erasable programmable read-only memory circuit, or a mask read-only memory circuit), volatile memory circuits (such as a static random access memory circuit or a dynamic random access memory circuit), magnetic storage media (such as an analog or digital magnetic tape or a hard disk drive), and optical storage media (such as a CD, a DVD, or a Blu-ray Disc).

In this application, apparatus elements described as having particular attributes or performing particular operations are specifically configured to have those particular attributes and perform those particular operations. Specifically, a description of an element to perform an action means that the element is configured to perform the action. The configuration of an element may include programming of the element, such as by encoding instructions on a non-transitory, tangible computer-readable medium associated with the element.

The apparatuses and methods described in this application may be partially or fully implemented by a special purpose computer created by configuring a general purpose computer to execute one or more particular functions embodied in computer programs. The functional blocks, flowchart components, and other elements described above serve as software specifications, which can be translated into the computer programs by the routine work of a skilled technician or programmer.

The computer programs include processor-executable instructions that are stored on at least one non-transitory, tangible computer-readable medium. The computer programs may also include or rely on stored data. The computer programs may encompass a basic input/output system (BIOS) that interacts with hardware of the special purpose computer, device drivers that interact with particular devices of the special purpose computer, one or more operating systems, user applications, background services, background applications, etc.

The computer programs may include: (i) descriptive text to be parsed, such as HTML (hypertext markup language), XML (extensible markup language), or JSON (JavaScript Object Notation) (ii) assembly code, (iii) object code generated from source code by a compiler, (iv) source code for execution by an interpreter, (v) source code for compilation and execution by a just-in-time compiler, etc. As examples only, source code may be written using syntax from languages including C, C++, C #, Objective-C, Swift, Haskell, Go, SQL, R, Lisp, Java®, Fortran, Perl, Pascal, Curl, OCaml, Javascript®, HTML5 (Hypertext Markup Language 5th revision), Ada, ASP (Active Server Pages), PHP (PHP:

Hypertext Preprocessor), Scala, Eiffel, Smalltalk, Erlang, Ruby, Flash®, Visual Basic®, Lua, MATLAB, SIMULINK, and Python®.

What is claimed is:

1. A method of forming an integrated circuit, the method comprising:
   forming a dielectric layer, a hard mask layer, a film layer and a photoresist layer;
   patterning the photoresist layer to form a via mask, wherein the via mask is oversized, such that the via mask extends across opposing sides of a metal line mask in the hard mask layer;
   etching the film layer and the dielectric layer based on the patterned photoresist layer;
   ashing the photoresist layer and the film layer;
   etching the dielectric layer based on a pattern of the hard mask layer to provide a via region and a metal line region;
   etching the hard mask layer and the dielectric layer; and
   performing a plurality of dual damascene process operations to form a via in the via region and a metal line in the metal line region in the integrated circuit.

2. The method of claim 1, wherein the dielectric layer includes a plurality of dielectric layers including a capped layer.

3. The method of claim 1, further comprising:
   forming a stack including the dielectric layer and the hard mask layer,
   wherein the film layer is a first film layer and the photoresist layer is a first photoresist layer, and
   wherein the stack includes a second film layer and a second photoresist layer;
   patterning the first photoresist layer and, based on the patterned first photoresist layer, etching the hard mask layer to form the metal line mask in the hard mask layer;
   ashing the first photoresist layer and the first film layer; and
   forming the second film layer and the second photoresist layer on the hard mask layer.

4. The method of claim 3, wherein the second film layer comprises at least one of amorphous silicon or an anti-reflective coating film.

5. The method of claim 1, wherein:
   the hard mask layer is formed on the dielectric layer;
   the film layer is formed on the hard mask layer; and
   the photoresist layer is formed on the film layer.

6. The method of claim 1, wherein the hard mask layer is formed of titanium nitride.

7. The method of claim 1, wherein:
   the hard mask layer is used as a first mask layer to mask a portion of the dielectric layer; and
   the portion of the dielectric layer is used as a second mask layer to mask a second portion of the dielectric layer.

8. The method of claim 1, wherein the film layer comprises at least one of amorphous silicon or an anti-reflective coating film.

9. The method of claim 1, wherein the film layer and the dielectric layer are anisotropically etched based on the patterned photoresist layer.

10. The method of claim 1, wherein the etching of the dielectric layer comprises etching a first portion of the dielectric layer based on a pattern of the hard mask layer and a pattern of a second portion of the dielectric layer.

11. The method of claim 1, wherein the dielectric layer is anisotropically etched based on the pattern of the hard mask layer.

12. The method of claim 1, further comprising, prior to forming the dielectric layer, forming an interconnect layer and forming an etch stop layer on the interconnect layer,
   wherein subsequent to etching the dielectric layer and prior to performing the plurality of dual damascene process operations, etching the etch stop layer until a top surface of the interconnect layer is reached.

13. The method of claim 1, wherein the plurality of dual damascene process operations comprise:
   forming a barrier layer in the via region and the metal line region;
   forming a seed layer on the barrier layer; and
   electroplating the seed layer.

14. A processing system for processing a substrate and forming an integrated circuit, wherein the processing system comprises:
   a processor;
   a memory; and
   one or more applications stored in the memory and including instructions, which are executable by the processor to
      form a dielectric layer, a hard mask layer, a film layer and a photoresist layer;
      pattern the photoresist layer to form a via mask, wherein the via mask is oversized, such that the via mask extends across opposing sides of a metal line mask in the hard mask layer;
      etch the film layer and the dielectric layer based on the patterned photoresist layer;
      ash the photoresist layer and the film layer;
      etch the dielectric layer based on a pattern of the hard mask layer to provide a via region and a metal line region;
      etch the hard mask layer and the dielectric layer; and
      perform a plurality of dual damascene process operations to form a via in the via region and a metal line in the metal line region in the integrated circuit.

15. The processing system of claim 14, wherein the instructions are executable by the processor to:
   form a stack including the dielectric layer and the hard mask layer,
   wherein the film layer is a first film layer and the photoresist layer is a first photoresist layer, and
   wherein the stack includes a second film layer and a second photoresist layer;
   pattern the first photoresist layer and, based on the patterned first photoresist layer, etch the hard mask layer to form the metal line mask in the hard mask layer;
   ash the first photoresist layer and the first film layer; and
   form the second film layer and the second photoresist layer on the hard mask layer.

16. The processing system of claim 14, wherein:
   the hard mask layer is used as a first mask layer to mask a first portion of the dielectric layer; and
   the first portion of the dielectric layer is used as a second mask layer to mask a second portion of the dielectric layer.

17. The processing system of claim 14, wherein:
   the film layer is formed on the hard mask layer; and
   the photoresist layer is formed on the film layer.

18. The processing system of claim 14, wherein:
   the film layer and the dielectric layer are anisotropically etched based on the patterned photoresist layer; and
   the dielectric layer is anisotropically etched based on the pattern of the hard mask layer.

19. The processing system of claim 14, wherein the etching of the dielectric layer comprises:

etching a first portion of the dielectric layer based on a pattern of the hard mask layer and a pattern of a second portion of the dielectric layer;

subsequent to etching the first portion of the dielectric layer, etching the second portion of the dielectric layer based on a pattern of the hard mask layer; and subsequent to etching the second portion of the dielectric layer, etching the first portion of the dielectric layer based on a pattern of the hard mask layer and a pattern of the second portion of the dielectric layer.

20. The processing system of claim 14, wherein the plurality of dual damascene process operations comprise:

forming a barrier layer in the via region and the metal line region;

forming a seed layer on the barrier layer; and electroplating the seed layer.

* * * * *